United States Patent
Karimata (10) Patent No.: US 10,900,573 B2
(45) Date of Patent: Jan. 26, 2021

(54) GATE VALVE

(71) Applicant: EBARA CORPORATION, Tokyo (JP)

(72) Inventor: Tsutomu Karimata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/511,363

(22) Filed: Jul. 15, 2019

(65) Prior Publication Data

US 2020/0027686 A1   Jan. 23, 2020

(30) Foreign Application Priority Data

Jul. 17, 2018   (JP) ................................. 2018-133861

(51) Int. Cl.
*F16K 3/02*        (2006.01)
(52) U.S. Cl.
CPC .................................. *F16K 3/0218* (2013.01)
(58) Field of Classification Search
CPC . F16K 3/0218; F16K 3/10; F16K 3/18; F16K 3/188; F16K 3/02; F16K 3/0245; F16K 3/316; F16K 3/3165; F16K 99/0011
See application file for complete search history.

(56) References Cited

U.S. PATENT DOCUMENTS

| 2005/0139799 A1* | 6/2005 | Tomasch | F16K 43/008 |
| | | | 251/193 |
| 2006/0169939 A1* | 8/2006 | Kihara | F16K 51/02 |
| | | | 251/193 |

FOREIGN PATENT DOCUMENTS

| JP | 2006-200709 A | 8/2006 |
| JP | 2008-116016 A | 5/2008 |

* cited by examiner

*Primary Examiner* — Hailey K. Do
(74) *Attorney, Agent, or Firm* — Pearne & Gordon LLP (57) ABSTRACT

A gate valve 1 includes: a plate 2 having an opening portion 9; a plate 3 located opposite to the plate 2; a guide space 5 formed between the plates 2, 3; and a plate 6 provided in the space 5. The plate 6 is slidable along a direction in which an opening portion 11 is offset from the opening portion 9 in the space 5 in a state in which the plate 6 is pressed by the pressing portion 13 and separated from the plate 2, and a position of the plate 6 is fixed with respect to the plate 2 in the space 5 in a state in which the plate 6 is pressed by the pressing portion 16 and is in contact with the plate 2. The pressing portions 13, 16 each have a bellows structure formed by diffusion-bonding metal plates 18 and 19 to each other.

7 Claims, 10 Drawing Sheets

GATE VALVE

CROSS-REFERENCE TO RELATED APPLICATIONS

This application claims the benefit of Japanese Priority Patent Application JP 2018-133861 filed on Jul. 17, 2018, the entire contents of which are incorporated herein by reference.

FIELD

The present invention relates to a thin gate valve.

BACKGROUND AND SUMMARY

Hitherto, in apparatuses such as an electron microscope and an electron beam inspection apparatus, a gate valve for partitioning a space in which an electron gun that generates an electron beam is provided and a space in which an object to be inspected (sample) that is irradiated with the electron beam is provided into two spaces is provided (for example, see Japanese Patent Laid-Open No. 2006-200709 and Japanese Patent Laid-Open No. 2008-116016).

The gate valve is used in a case as below. For example, when gas is generated from the sample and the degree of vacuum is deteriorated as a result of irradiating the sample with the electron beam, the gate valve is closed in order to protect the electron gun. When the sample is replaced, the degree of vacuum of the space in which the sample is provided is deteriorated, and hence the gate valve is closed in order to protect the electron gun.

Figure 10:
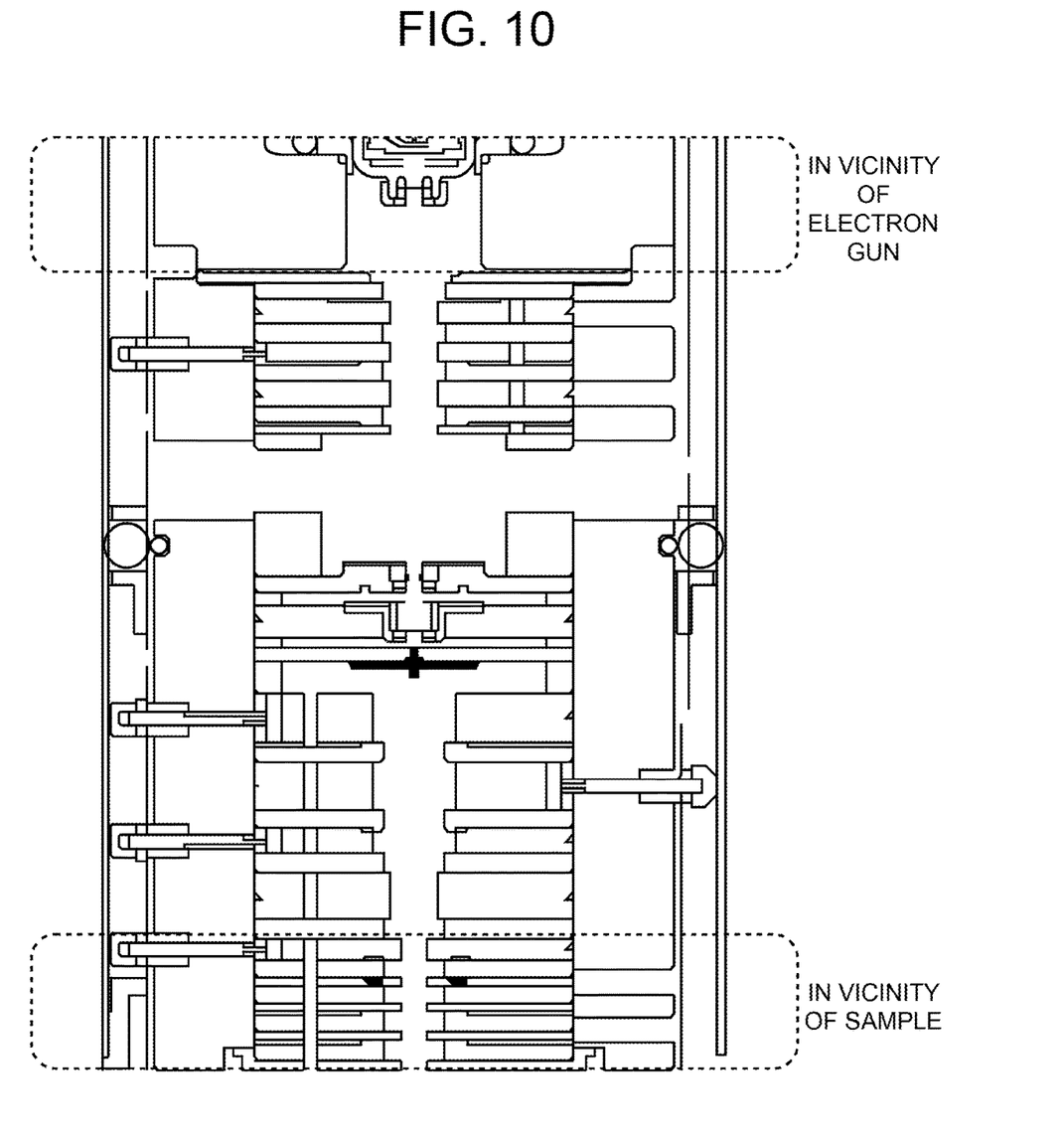
FIG. 10 illustrates the inside of the apparatus of a small-sized electron microscope.

In recent years, apparatuses such as the electron microscope and the electron beam inspection apparatus are also being increasingly downsized, and the space in each of those apparatuses is decreasing. Accordingly, technologies for downsizing the gate valve are being developed, but the limit in the reduction of thickness has been ten-odd millimeters for the gate valve of the conventional art. In a small-sized electron microscope and a small-sized electron beam inspection apparatus, the gate valve of the conventional art can be provided in the vicinity of an electron gun with a certain degree of extra spatial room in some way, but it has been impossible to provide the gate valve of the conventional art in the vicinity of a sample with hardly any extra spatial room (see FIG. 10). Therefore, the development of a thin gate valve that can be provided in the vicinity of the sample even in a small-sized electron microscope and a small-sized electron beam inspection apparatus has been desired.

The present invention has been made in view of the situation described above, and an object thereof is to provide a thin gate valve.

A gate valve of one embodiment includes: a first plate having a first opening portion; a second plate having a second opening portion and located opposite to the first plate; a valve body guide space formed between the first plate and the second plate; and a valve body plate provided in the valve body guide space and having a valve body opening portion, in which: the first plate has a first pressing portion provided thereon, the first pressing portion pressing the valve body plate in a direction away from the first plate; the second plate has a second pressing portion provided thereon, the second pressing portion pressing the valve body plate in a direction toward the first plate; the valve body plate is slidable along a direction in which the valve body opening portion is offset from the first opening portion in the valve body guide space in a state in which the valve body plate is pressed by the first pressing portion and separated from the first plate; a position of the valve body plate is fixed with respect to the first plate in the valve body guide space in a state in which the valve body plate is pressed by the second pressing portion and is in contact with the first plate; and the first pressing portion and the second pressing portion each have a bellows structure formed by diffusion-bonding a plurality of thin plates made of metal to each other.

DETAILED DESCRIPTION OF NON-LIMITING EXAMPLE EMBODIMENTS

A gate valve of an embodiment is described below. Note that the embodiment described below indicates an example when the present technology is carried out, and does not limit the present technology to the specific configurations described below. When the present technology is carried out, specific configurations according to the embodiment may be employed, as appropriate.

A gate valve of the present invention includes: a first plate having a first opening portion; a second plate having a second opening portion and located opposite to the first plate; a valve body guide space formed between the first plate and the second plate; and a valve body plate provided in the valve body guide space and having a valve body opening portion, in which: the first plate has a first pressing portion provided thereon, the first pressing portion pressing the valve body plate in a direction away from the first plate; the second plate has a second pressing portion provided thereon, the second pressing portion pressing the valve body plate in a direction toward the first plate; the valve body plate is slidable along a direction in which the valve body opening portion is offset from the first opening portion in the valve body guide space in a state in which the valve body plate is pressed by the first pressing portion and separated from the first plate; a position of the valve body plate is fixed with respect to the first plate in the valve body guide space in a state in which the valve body plate is pressed by the second pressing portion and is in contact with the first plate;

and the first pressing portion and the second pressing portion each have a bellows structure formed by diffusion-bonding a plurality of thin plates made of metal to each other.

According to the configuration, the bellows structures of the first pressing portion and the second pressing portion are formed by diffusion-bonding the plurality of thin plates made of metal to each other, and hence the thickness of the gate valve can be reduced. As a result, the thickness of the gate valve can be reduced to a thickness (2 mm to 3 mm) that has been extremely difficult to achieve with the conventional gate valve.

In the gate valve of the present invention, the first pressing portion provided on the first plate may be larger than the second pressing portion provided on the second plate in number.

According to the configuration, many first pressing portions are provided. The valve body plate in a state of being in contact with the first plate is in close contact with the first plate, thereby causing the separation from the first plate to be difficult. Therefore, a larger force is needed in order to separate the valve body plate (the valve body plate in close contact with the first plate) from the first plate. In this case, many first pressing portions are provided, and hence the valve body plate can be easily separated from the first plate.

In the gate valve of the present invention, the first pressing portion may be controlled by a first control unit, the first plate may have at least three of the first pressing portions provided thereon, the at least three first pressing portions may be provided in a ring-like manner, and the first control unit may successively operate the first pressing portions provided in the ring-like manner along a predetermined rotation direction when the first pressing portions press the valve body plate in the direction away from the first plate.

According to the configuration, at least three first pressing portions are provided on the first plate in a ring-like manner, and the first pressing portions provided in a ring-like manner are successively operated along a predetermined rotation direction when the valve body plate is separated from the first plate by the first pressing portions. As a result, force is successively applied to the valve body plate from the first pressing portions provided in a ring-like manner along a predetermined rotation direction, and hence the valve body plate can be smoothly separated from the first plate.

In the gate valve of the present invention, the second pressing portion may be controlled by a second control unit, the second plate may have at least two of the second pressing portions provided thereon, and the second control unit may simultaneously operate the second pressing portions when the second pressing portions press the valve body plate in the direction toward the first plate.

According to the configuration, when the valve body plate is pressed against the first plate by the second pressing portions, the plurality of second pressing portions are simultaneously operated. As a result, force is equally applied to the valve body plate from the plurality of provided second pressing portions, and hence the valve body plate can be appropriately pressed against the first plate, and the airtightness between the valve body plate and the first plate can be appropriately maintained.

In the gate valve of the present invention, the valve body plate may have a ring-like sealing member provided thereon, the ring-like sealing member being provided so as to surround the first opening portion when the valve body plate is slid in the direction in which the valve body opening portion is offset from the first opening portion.

According to the configuration, in a state in which the valve body opening portion is offset from the first opening portion, the first opening portion is surrounded by the sealing member, and the airtightness between the valve body plate and the first plate can be secured in an excellent manner.

In the gate valve of the present invention, the sealing member may be formed by a material having adhesiveness and detachability with respect to the first plate.

According to the configuration, the sealing member has adhesiveness, and hence the airtightness between the valve body plate and the first plate can be secured in an excellent manner when the valve body plate is pressed against the first plate. The sealing member has detachability, and hence the valve body plate can be easily separated from the first plate.

In the gate valve of the present invention, the first plate may have a wall member provided thereon, the wall member being provided on a periphery of the valve body opening portion, the first plate, the valve body plate, and the wall member may be made of an electrically conductive material, and the first plate or the valve body plate may be grounded.

According to the configuration, the wall member is provided on the periphery of the valve body opening portion, and the first plate, the valve body plate, and the wall member have electrical conductivity. Therefore, when a charged particle beam (for example, the electron beam) passes through the first opening portion and the valve body opening portion in a state in which the valve body opening portion is provided in a position corresponding to the first opening portion, the charge due to generated stray electrons can be released from the wall member through the grounded first plate and valve body plate. As a result, the gate valve can be used as a GND electrode.

According to the present invention, the thickness of the gate valve can be reduced.

The gate valve of the embodiment of the present invention is described below with reference to the drawings. In this embodiment, a case of a gate valve used in a small-sized electron microscope, a small-sized electron beam inspection apparatus, and the like is exemplified.

Figure 1:
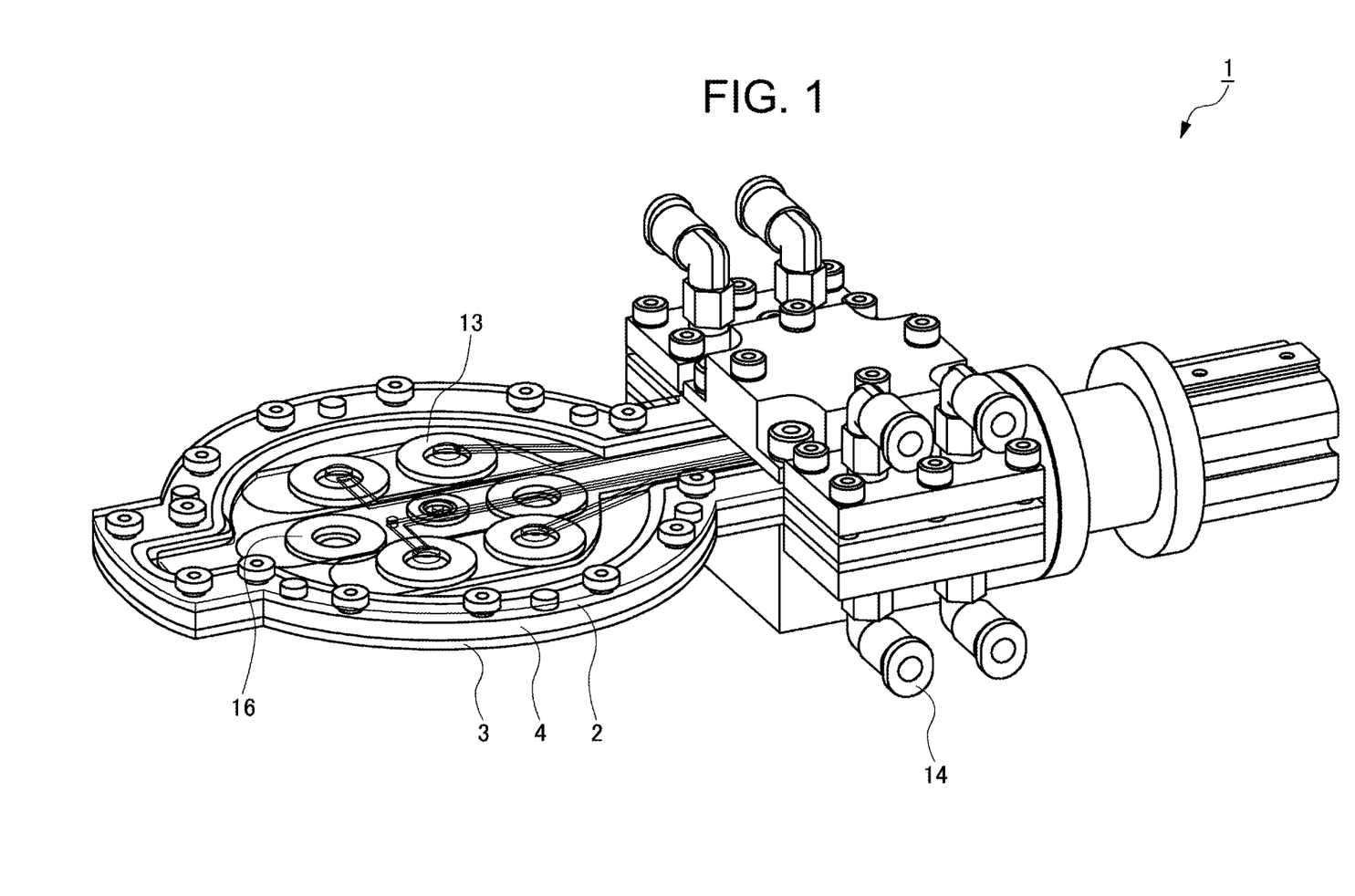
FIG. 1 is a perspective view of a gate valve of an embodiment of the present invention.
Figure 2:
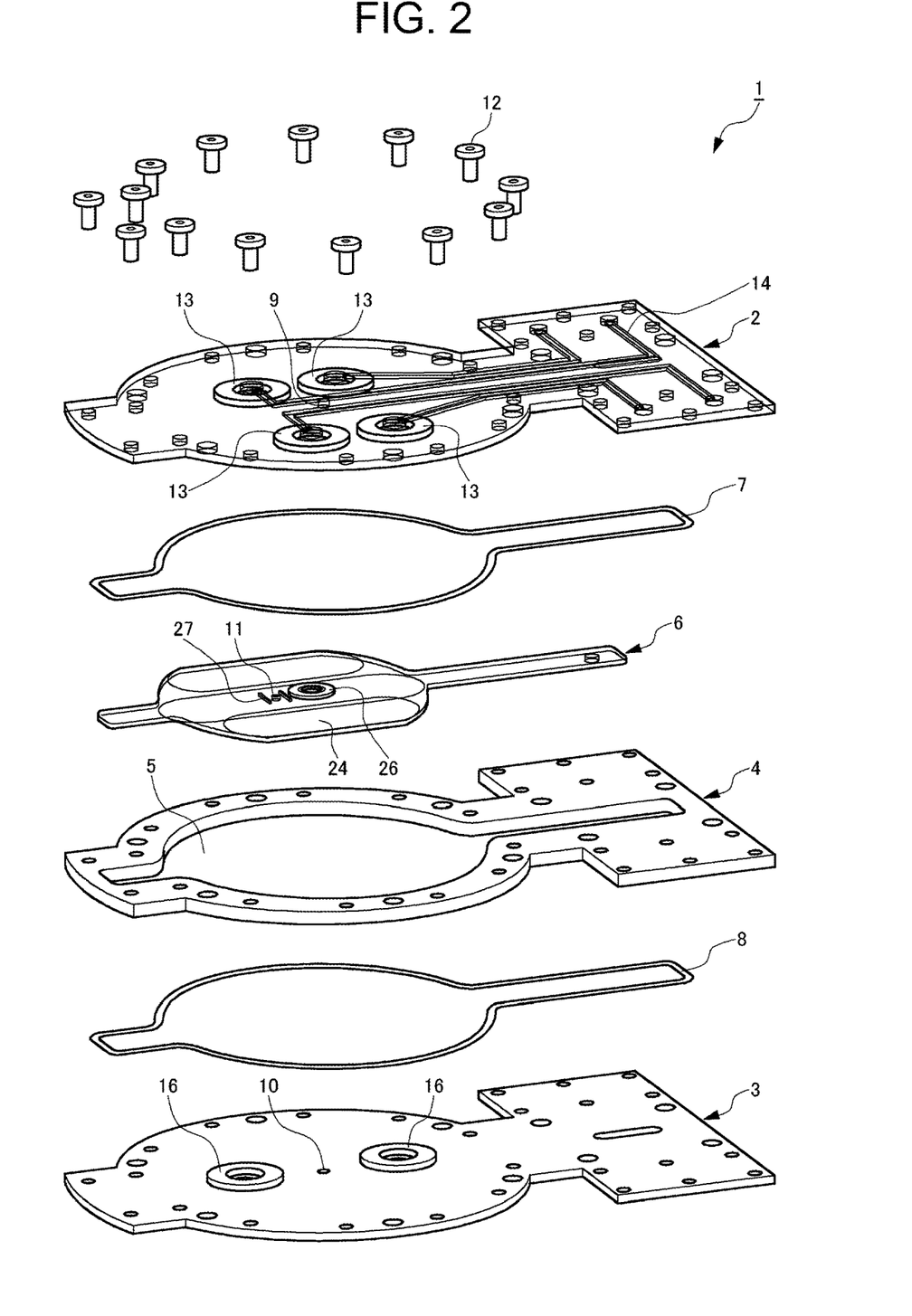
FIG. 2 is an exploded perspective view of the gate valve of the embodiment of the present invention.

The configuration of the gate valve of this embodiment is described with reference to the drawings. FIG. 1 is a perspective view of the gate valve of this embodiment, and FIG. 2 is an exploded perspective view of the gate valve of this embodiment. As illustrated in FIG. 1 and FIG. 2, a gate valve 1 includes a first plate 2 provided on the light source side of the electron beam (the upper side in FIG. 1 and FIG. 2), a second plate 3 located on the sample side (the lower side in FIG. 1 and FIG. 2) opposite to the first plate 2, an intermediate plate 4 fixed to the upper surface of the second plate 3, and a valve body plate 6 provided in a valve body guide space 5 formed in the central portion of the intermediate plate 4. The first plate 2, the second plate 3, the intermediate plate 4, and the valve body plate 6 are all made of metal (for example, the first plate 2, the second plate 3, and the intermediate plate 4 are made of stainless steel, and the valve body plate 6 made of titanium). The first plate 2 and the second plate 3 are grounded to GND.

A first gasket 7 is provided between the first plate 2 and the intermediate plate 4, and a second gasket 8 is provided between the second plate 3 and the intermediate plate 4. The first gasket 7 and the second gasket 8 are both made of airtight resin (for example, made of silicone). Note that the intermediate plate 4 may be integrally manufactured with the second plate. In this case, the second gasket 8 is unnecessary.

A first opening portion 9 is formed in the first plate 2 in a position corresponding to an optical axis of the electron beam. A second opening portion 10 is formed in the second plate 3 in a position corresponding to the first opening portion 9 (the position corresponding to the optical axis of the electron beam). A valve body opening portion 11 for causing the electron beam to pass therethrough is formed in the valve body plate 6.

The first plate 2 and the second plate 3 are fixed to each other by bolts 12. At this time, the intermediate plate 4 is fixed to the second plate 3. At this time, the valve body plate 6 is movable in the valve body guide space 5 in the intermediate plate 4 fixed to the second plate 3. Specifically, the valve body plate 6 is vertically movable in the direction (the vertical direction in FIG. 1 and FIG. 2) along the optical axis of the electron beam. The valve body plate 6 is movable in a sliding manner in the direction (the horizontal direction in FIG. 1 and FIG. 2) intersecting with the optical axis of the electron beam.

On the lower surface of the first plate 2, first pressing portions 13 that press the valve body plate 6 in a direction (the downward direction in FIG. 1 and FIG. 2) away from the first plate are provided. In this embodiment, four first pressing portions 13 are provided in a square ring-like manner. Air supply paths 14 are connected to the first pressing portions 13, and the first pressing portions 13 are formed to press the valve body plate 6 in the direction away from the first plate by being supplied with air from the air supply paths 14. The supplying of air to the first pressing portions 13 is controlled by a first control unit 15 (see FIGS. 7A and 7B to FIGS. 9A and 9B).

On the upper surface of the second plate 3, second pressing portions 16 that press the valve body plate 6 in the direction (the upward direction in FIG. 1 and FIG. 2) toward the first plate are provided. In this embodiment, two second pressing portions 16 are provided side to side. As with the first pressing portions 13, the air supply paths 14 are also connected to the second pressing portions 16, and the second pressing portions 16 are formed to press the valve body plate 6 in the direction toward the first plate by being supplied with air from the air supply paths 14. The supplying of air to the second pressing portions 16 is controlled by the second control unit 17 (see FIGS. 7A and 7B to FIGS. 9A and 9B).

Figure 3:
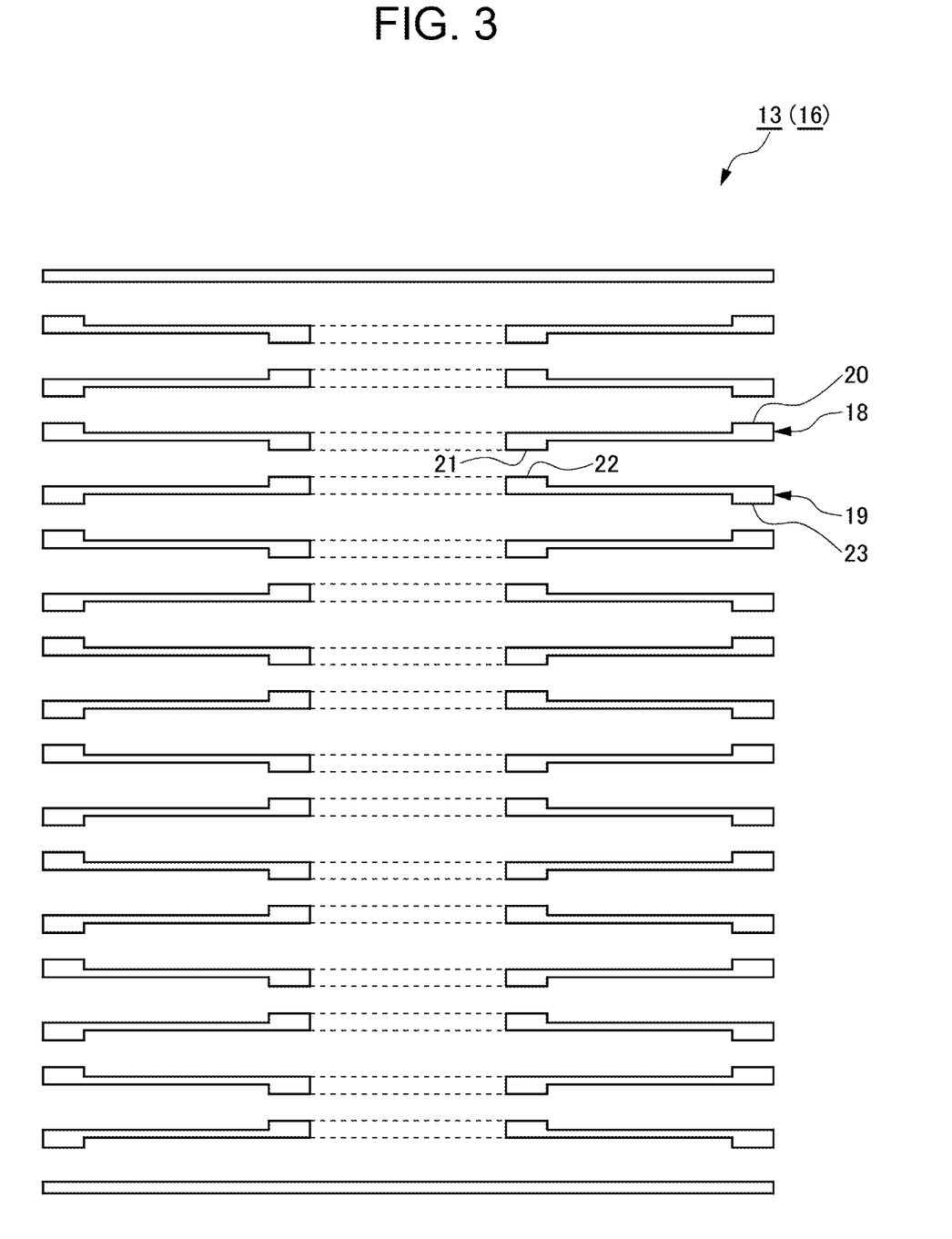
FIG. 3 is an explanatory drawing of a bellows structure (before diffusion-bonding) of the embodiment of the present invention.
Figure 4:
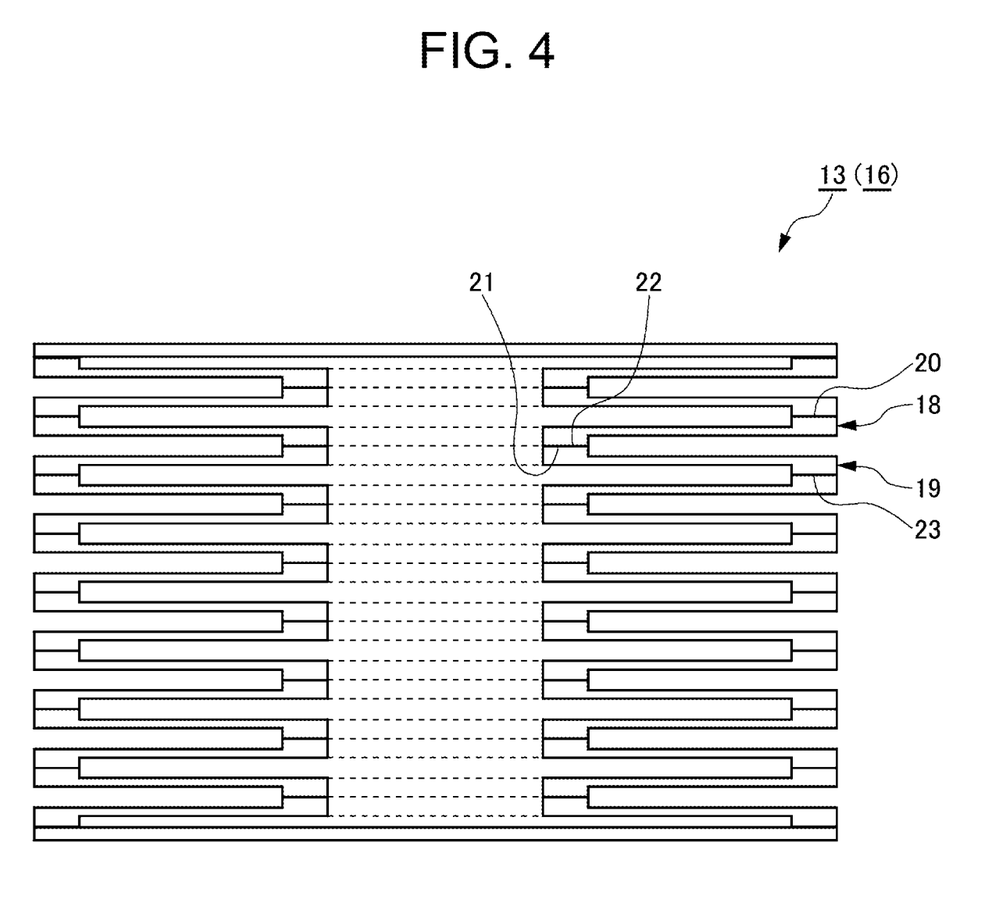
FIG. 4 is an explanatory drawing of the bellows structure (after diffusion-bonding) of the embodiment of the present invention.

Now, with reference to FIG. 3 and FIG. 4, the structures of the first pressing portion 13 and the second pressing portion 16 are described. In this embodiment, the first pressing portion 13 and the second pressing portion 16 have the same structure. FIG. 3 and FIG. 4 are explanatory drawings of the structures of the first pressing portion 13 and the second pressing portion 16. As illustrated in FIG. 3 and FIG. 4, the first pressing portion 13 and the second pressing portion 16 each have a bellows structure formed by diffusion-bonding a plurality of thin plates made of metal to each other.

In this case, the bellows structure is formed by causing first thin plates 18 and second thin plates 19 to overlap each other. The first thin plate 18 includes a disk-like (circular ring-like) main body having an opening in the center, a circular ring-like upper-surface outer protruding portion 20 provided on the outer side of the upper surface of the main body, and a circular ring-like lower-surface inner protruding portion 21 provided on the inner side of the lower surface of the main body. The second thin plate 19 includes a disk-like (circular ring-like) main body having an opening in the center, a circular ring-like upper-surface inner protruding portion 22 provided on the inner side of the upper surface of the main body, and a circular ring-like lower-surface outer protruding portion 23 provided on the outer side of the lower surface of the main body.

The bellows structure is formed by diffusion-bonding the upper-surface outer protruding portions 20 of the first thin plates 18 and the lower-surface outer protruding portions 23 of the second thin plate 19 to each other, and diffusion-bonding the lower-surface inner protruding portions 21 of the first thin plates 18 and the upper-surface inner protruding portions 22 of the second thin plates 19 to each other in a state in which the first thin plates 18 and the second thin plates 19 overlap each other.

Figure 5:
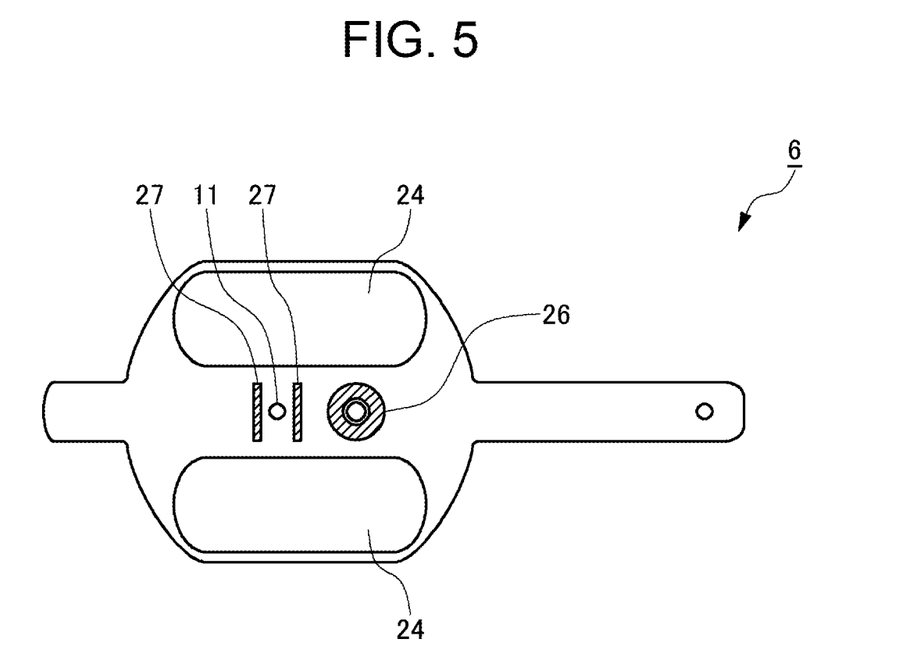
FIG. 5 is a top view of a valve body plate of the embodiment of the present invention.
Figure 6:
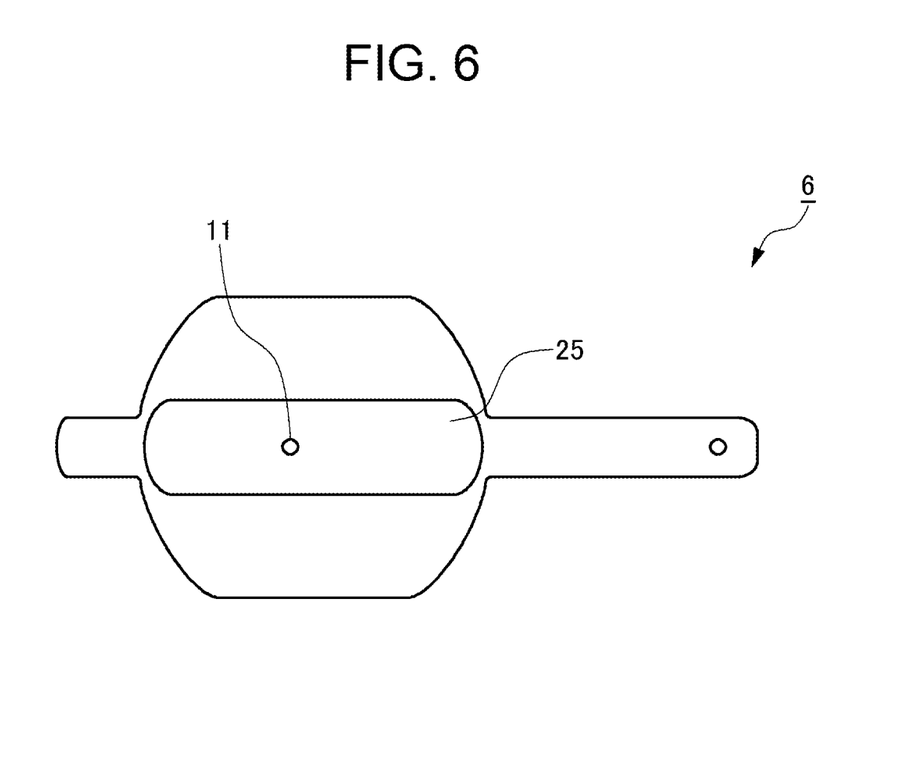
FIG. 6 is a bottom view of the valve body plate of the embodiment of the present invention.

Next, with reference to FIG. 5 and FIG. 6, the configuration of the valve body plate 6 is described. FIG. 5 is a top view of the valve body plate 6, and FIG. 6 is a bottom view of the valve body plate 6. As illustrated in FIG. 5, first recessed portions 24 in which the first pressing portions 13 of the first plate 2 are stored are formed in the upper surface of the valve body plate 6 (the surface on the first plate 2 side, the surface on the upper side in FIG. 1 and FIG. 2). As illustrated in FIG. 6, a second recessed portion 25 in which the second pressing portions 16 of the second plate 3 are stored is formed in the lower surface of the valve body plate 6 (the surface on the second plate 3 side, the surface on the lower side in FIG. 1 and FIG. 2).

As illustrated in FIG. 5, on the upper surface of the valve body plate 6, a ring-like sealing member 26 provided so as to surround the first opening portion 9 when the valve body plate 6 is slid in the direction in which the valve body opening portion 11 is offset from the first opening portion 9 is provided. The sealing member 26 is made of resin (for example, made of silicone) that has adhesiveness and detachability with respect to the first plate 2. A pair of linear wall members 27 provided on the periphery of the valve body opening portion 11 is provided on the upper surface of the valve body plate 6. The wall members 27 are made of electrically conductive resin (for example, made of silicone containing carbon).

The operation of the gate valve 1 formed as above is described with reference to FIGS. 7A and 7B to FIGS. 9A and 9B.

Figure 7A:
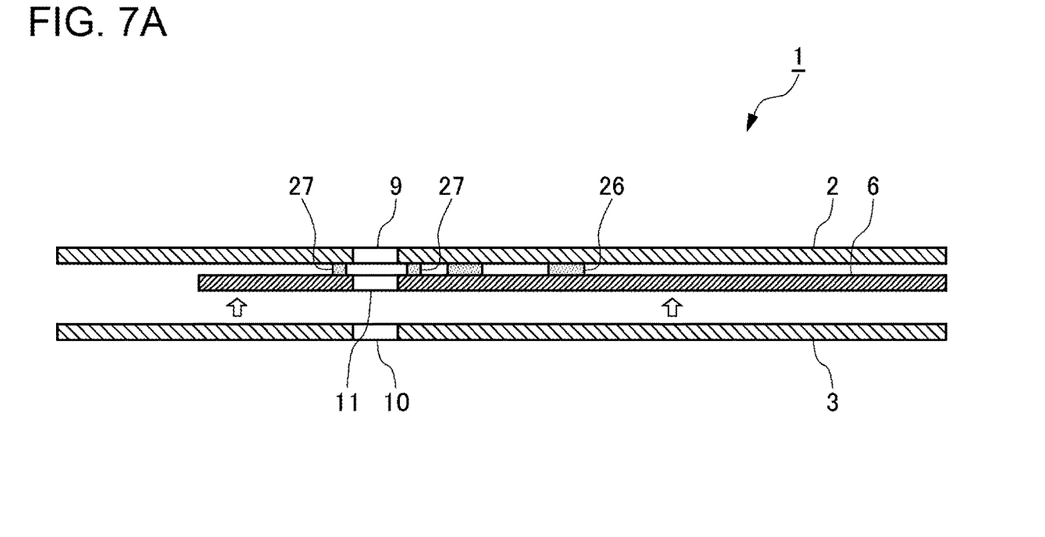
FIGS. 7A and 7B are explanatory drawings of the operation of the gate valve of the embodiment of the present invention.
Figure 7B:
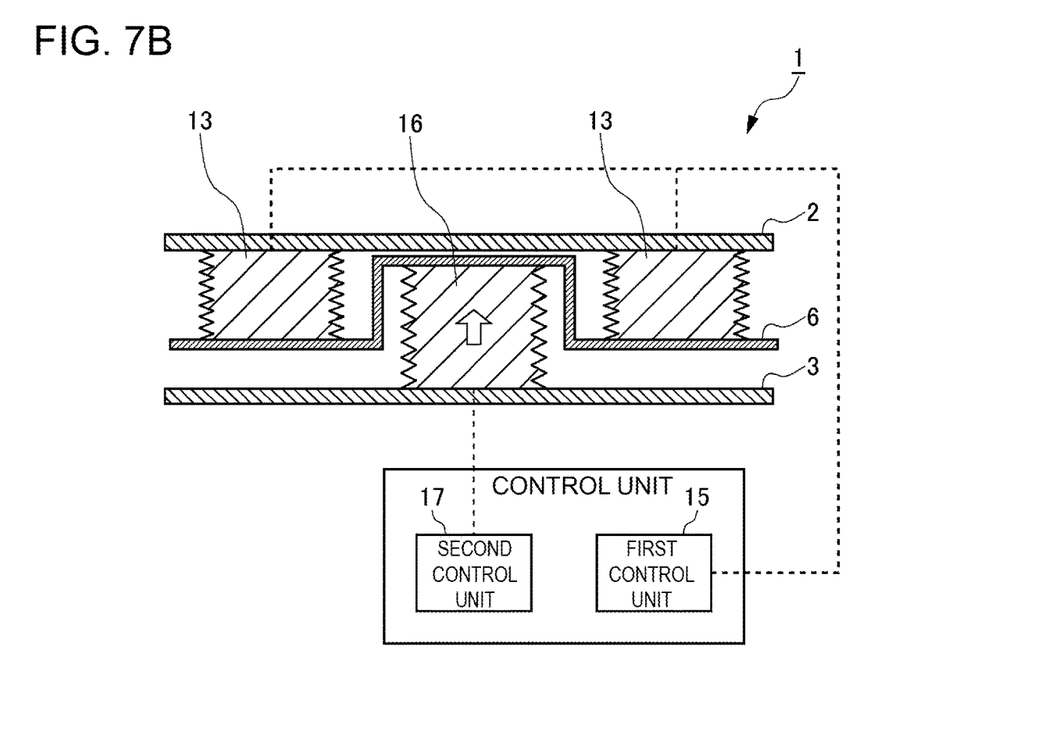

For example, when the gate valve 1 is caused to be in an opened state, for example, when the sample is irradiated with the electron beam, as illustrated in FIG. 7A, the valve body opening portion 11 in the valve body plate 6 is provided in a position (the position in the optical axis of the electron beam) corresponding to the first opening portion 9 in the first plate 2 (and the second opening portion 10 in the second plate 3). Then, as illustrated in FIG. 7B, the second pressing portions 16 are operated by the second control unit 17, and the valve body plate 6 is pressed in the direction toward the first plate 2 by the second pressing portions 16. At this time, the two second pressing portions 16 are simultaneously operated. The position of the valve body plate 6 is fixed with respect to the first plate 2 in the valve body guide space 5 in a state in which the valve body plate 6 is pressed by the second pressing portions 16 and is in contact with the first plate 2.

Figure 8A:
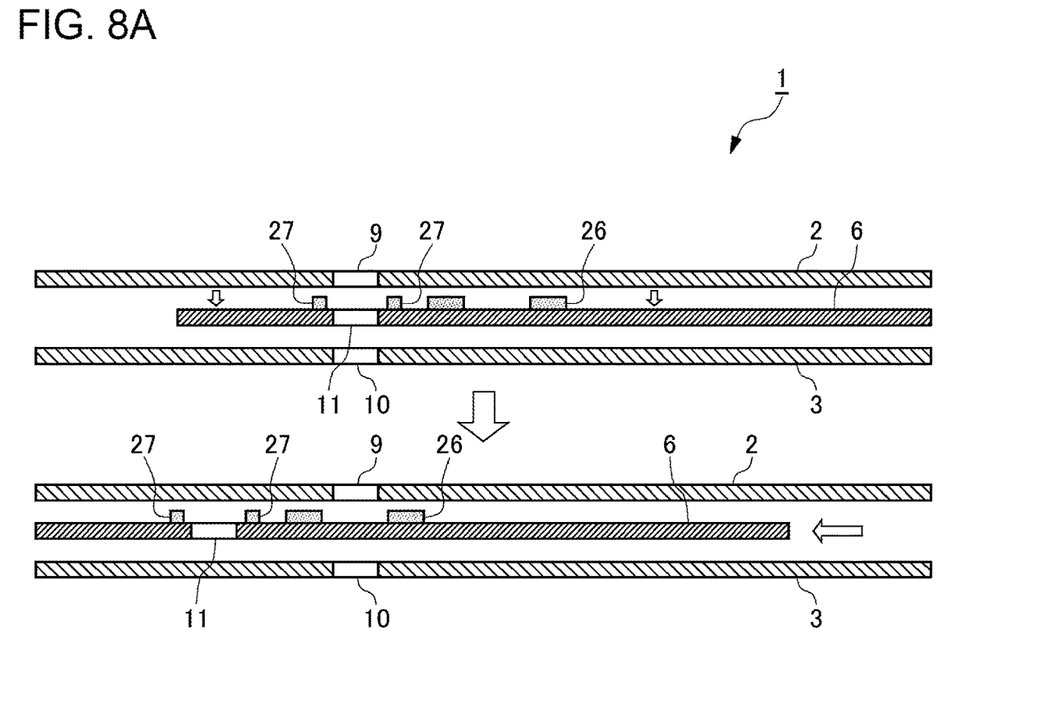
FIGS. 8A and 8B are explanatory drawings of the operation of the gate valve of the embodiment of the present invention.
Figure 8B:
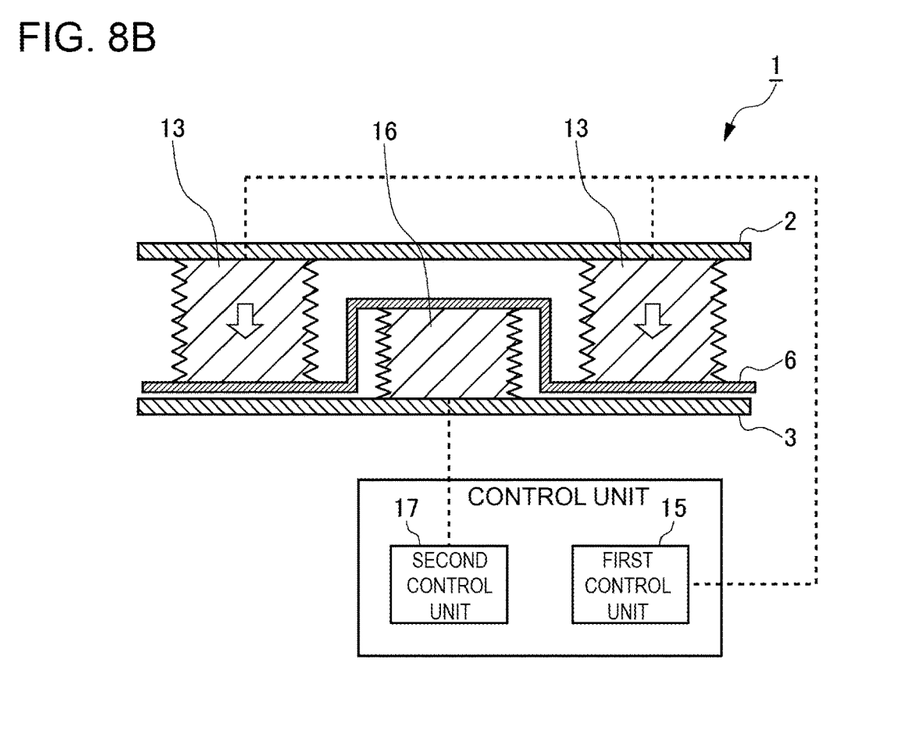

Next, when the gate valve 1 is caused to be in a closed state, for example, when the sample is replaced, as illustrated in FIG. 8B, the operation of the second control unit 17 is stopped, and the pressing (the pressing in the direction toward the first plate 2) against the valve body plate 6 by the second pressing portions 16 is stopped. Then, the first control unit 15 is operated, and the valve body plate 6 is pressed in the direction away from the first plate 2 by the first pressing portions 13. At this time, the four first pressing portions 13 are successively (for example, in a clockwise direction) operated along a predetermined rotation direction.

As a result, as illustrated in FIG. 8A, the valve body plate 6 is caused to be in a state of being pressed by the first pressing portions 13 and separated from the first plate 2. Then, when the state in which the valve body plate 6 is separated from the first plate 2 is obtained, the operation of the first pressing portions 13 is stopped, and the pressing (the pressing in the direction away from the first plate 2) against the valve body plate 6 by the first pressing portions 13 is stopped. In this state, the valve body plate 6 is not pressed from any of the first pressing portions 13 and the second pressing portions 16. Then, in the valve body guide space 5, the valve body plate 6 is moved in a sliding manner along the direction in which the valve body opening portion 11 is offset from the first opening portion 9, and the sealing member 26 of the valve body plate 6 is provided in a position corresponding to the first opening portion 9 in the first plate 2.

Figure 9A:
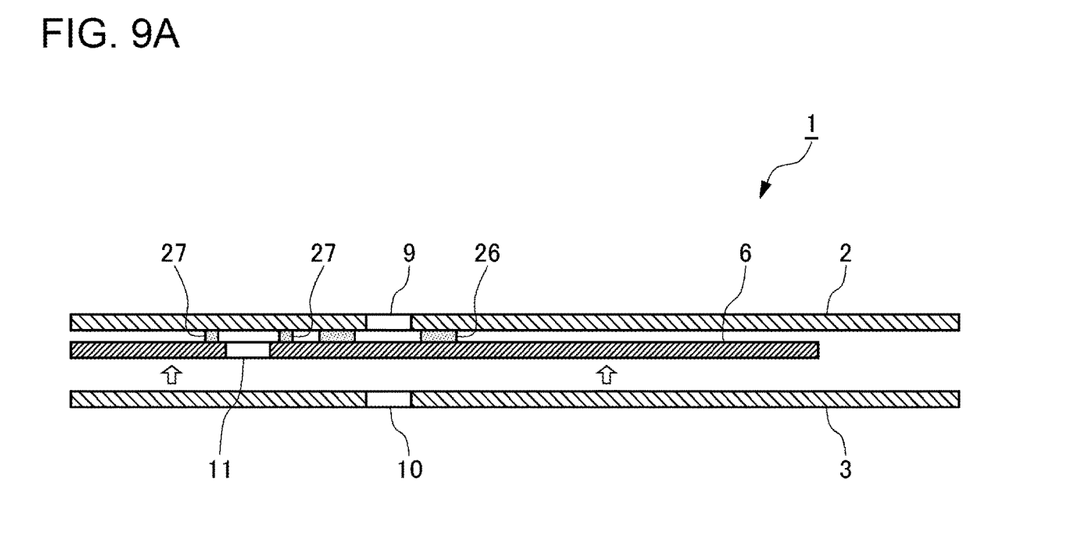
FIGS. 9A and 9B are explanatory drawings of the operation of the gate valve of the embodiment of the present invention.
Figure 9B:
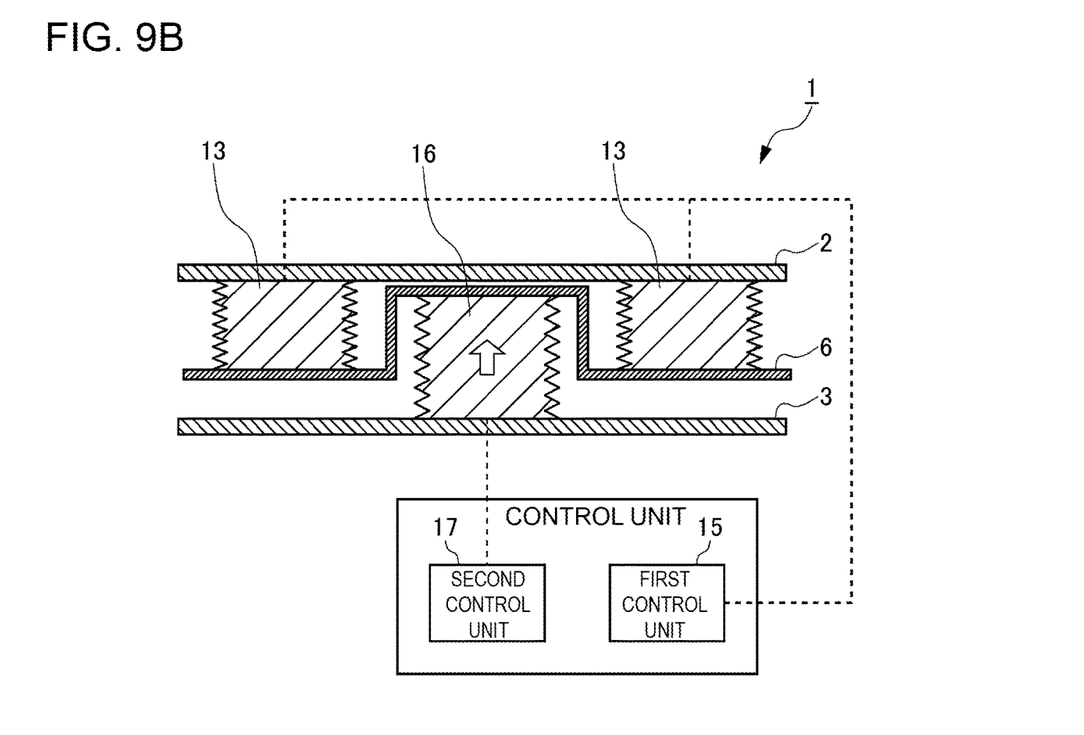

Then, as illustrated in FIGS. 9A and 9B, the second pressing portions 16 are operated by the second control unit 17, and the valve body plate 6 is pressed in the direction toward the first plate 2 by the second pressing portions 16. At this time, the two second pressing portions 16 are simultaneously operated. The position of the valve body plate 6 is fixed with respect to the first plate 2 in the valve body guide space 5 in a state in which the valve body plate 6 is being pressed by the second pressing portions 16 and in contact with the first plate 2.

According to the gate valve 1 of this embodiment as above, the bellows structures of the first pressing portions 13 and the second pressing portions 16 are formed by diffusion-bonding the plurality of thin plates 18 and 19 made of metal to each other, and hence the thickness of the gate valve 1 can be reduced. As a result, the thickness of the gate valve 1 can be reduced to a thickness (2 mm to 3 mm) that has been extremely difficult to achieve with the gate valve 1 of the conventional art.

In this embodiment, many first pressing portions 13 (more than the second pressing portions 16) are provided. The valve body plate 6 in a state of being in contact with the first plate 2 is in close contact with the first plate 2, thereby causing the separation from the first plate 2 to be difficult. Therefore, a larger force is needed in order to separate the valve body plate 6 (the valve body plate 6 in close contact with the first plate 2) from the first plate 2. In this case, many first pressing portions 13 are provided, and hence the valve body plate 6 can be easily separated from the first plate 2.

In this embodiment, at least three first pressing portions 13 are provided on the first plate 2 in a ring-like manner, and the first pressing portions 13 provided in a ring-like manner are successively operated along a predetermined rotation direction when the valve body plate 6 is separated from the first plate 2 by the first pressing portions 13. As a result, force is successively applied to the valve body plate 6 from the first pressing portions 13 provided in a ring-like manner along a predetermined rotation direction, and hence the valve body plate 6 can be smoothly separated from the first plate 2.

In this embodiment, when the valve body plate 6 is pressed against the first plate 2 by the second pressing portions 16, the plurality of second pressing portions 16 are simultaneously operated. As a result, force is equally applied to the valve body plate 6 from the plurality of provided second pressing portions 16, and hence the valve body plate 6 can be appropriately pressed against the first plate 2, and the airtightness between the valve body plate 6 and the first plate 2 can be appropriately maintained.

In this embodiment, in a state in which the valve body opening portion 11 is offset from the first opening portion 9, the first opening portion 9 is surrounded by the sealing member 26, and the airtightness between the valve body plate 6 and the first plate 2 can be secured in an excellent manner.

In this embodiment, the sealing member 26 has adhesiveness, and hence the airtightness between the valve body plate 6 and the first plate 2 can be secured in an excellent manner when the valve body plate 6 is pressed against the first plate 2. The sealing member 26 has detachability, and hence the valve body plate 6 can be easily separated from the first plate 2.

In this embodiment, the first plate 2 (and the second plate 3) are grounded, and the valve body plate 6 is also grounded via the first plate 2 (or the second plate 3). The wall members 27 are provided on the periphery of the valve body opening portion 11, and the first plate 2 (and the second plate 3), the valve body plate 6, and the wall members 27 have electrical conductivity. Therefore, when a charged particle beam (for example, the electron beam) passes through the first opening portion 9 and the valve body opening portion 11 in a state in which the valve body opening portion 11 is provided in a position corresponding to the first opening portion 9, the charge due to generated stray electrons can be released from the wall members 27 through the grounded first plate 2 and valve body plate 6. As a result, the gate valve 1 can be used as a GND electrode.

The embodiment of the present invention has been described above by exemplifications, but the scope of the present invention is not limited thereto, and changes and modifications can be made within the scope described in the claims in accordance with the object.

For example, in the embodiment described above, an example in which four first pressing portions 13 are provided on the first plate 2 and two second pressing portions 16 are provided on the second plate 3 is described, but the scope of the present invention is not limited thereto. The number of the first pressing portions 13 may be three or less or five or more. The number of the second pressing portions 16 may be one or three or more.

As described above, the gate valve according to the present invention has an effect in which the thickness of the gate valve can be reduced, is applied to a small-sized electron microscope, a small-sized electron beam inspection apparatus, and the like, and is useful.

1 Gate valve
2 First plate
3 Second plate
4 Intermediate plate
5 Valve body guide space
6 Valve body plate
7 First gasket
8 Second gasket
9 First opening portion
10 Second opening portion
11 Valve body opening portion
12 Bolt
13 First pressing portion
14 Air supply path
15 First control unit
16 Second pressing portion
17 Second control unit
18 First thin plate
19 Second thin plate
20 Upper-surface outer protruding portion
21 Lower-surface inner protruding portion 22 Upper-surface inner protruding portion
23 Lower-surface outer protruding portion
24 First recessed portion
25 Second recessed portion
26 Sealing member
27 Wall member

What is claimed is:

1. A gate valve, comprising:
a first plate having a first opening portion;
a second plate having a second opening portion and located opposite to the first plate;
a valve body guide space formed between the first plate and the second plate; and
a valve body plate provided in the valve body guide space and having a valve body opening portion, wherein:
the first plate has a first pressing portion provided thereon, the first pressing portion pressing the valve body plate in a direction away from the first plate;
the second plate has a second pressing portion provided thereon, the second pressing portion pressing the valve body plate in a direction toward the first plate;
the valve body plate is slidable along a direction in which the valve body opening portion is offset from the first opening portion in the valve body guide space in a first state in which the valve body plate is pressed by the first pressing portion and separated from the first plate;
a position of the valve body plate is fixed with respect to the first plate in the valve body guide space in a second state in which the valve body plate is pressed by the second pressing portion and is in contact with the first plate; and
the first pressing portion and the second pressing portion each have a bellows structure formed by diffusion-bonding a plurality of thin plates made of metal to each other.

2. The gate valve according to claim 1, wherein the first pressing portion provided on the first plate is larger than the second pressing portion provided on the second plate in number.

3. The gate valve according to claim 1, wherein:
the first pressing portion is controlled by a first control unit;
the first plate has at least three of the first pressing portions provided thereon;
the at least three first pressing portions are provided in a ring-like manner; and
the first control unit successively operates the first pressing portions provided in the ring-like manner along a predetermined rotation direction when the first pressing portions press the valve body plate in the direction away from the first plate.

4. The gate valve according to claim 1, wherein:
the second pressing portion is controlled by a second control unit;
the second plate has at least two of the second pressing portions provided thereon; and
the second control unit simultaneously operates the second pressing portions when the second pressing portions press the valve body plate in the direction toward the first plate.

5. The gate valve according to claim 1, wherein:
the first plate has a wall member provided thereon, the wall member being provided on a periphery of the valve body opening portion;
the first plate, the valve body plate, and the wall member are made of an electrically conductive material; and
the first plate or the valve body plate is grounded.

6. The gate valve according to claim 1, wherein the valve body plate has an annular sealing member provided thereon, the annular sealing member being provided so as to surround the first opening portion when the valve body plate is slid in the direction in which the valve body opening portion is offset from the first opening portion.

7. The gate valve according to claim 6, wherein the annular sealing member is formed by a material having adhesiveness and detachability with respect to the first plate.

* * * * *